United States Patent [19]

Bayraktaroglu

[11] Patent Number: 5,446,294

[45] Date of Patent: Aug. 29, 1995

[54] MICROWAVE HETEROJUNCTION BIPOLAR TRANSISTORS SUITABLE FOR LOW-POWER, LOW-NOISE AND HIGH-POWER APPLICATIONS AND METHOD FOR FABRICATING SAME

[75] Inventor: Burhan Bayraktaroglu, Plano, Tex.

[73] Assignee: Texas Instruments Incorporated, Dallas, Tex.

[21] Appl. No.: 738,691

[22] Filed: Jul. 31, 1991

[51] Int. Cl.[6] .................... H01L 39/22; H01L 29/06
[52] U.S. Cl. ................................ 257/34; 257/198
[58] Field of Search ................. 357/34, 16; 257/34

[56] References Cited

U.S. PATENT DOCUMENTS

| | | | |
|---|---|---|---|
| 4,868,613 | 9/1989 | Hirachi | 257/532 |
| 4,939,562 | 7/1990 | Alderstein | 357/34 |
| 5,041,882 | 8/1991 | Katoh | 257/198 |
| 5,097,312 | 3/1992 | Bayraktaroglu | 257/197 |

FOREIGN PATENT DOCUMENTS

| | | |
|---|---|---|
| 0335720 | 10/1989 | European Pat. Off. . |
| 0335720 | 10/1989 | European Pat. Off. . |
| 2309981 | 11/1976 | France . |
| 2352404 | 12/1977 | France . |
| 2352404 | 12/1977 | France . |

OTHER PUBLICATIONS

Miura, et al., "InAlAs/InGaAs HBT's Using magnesium P-type Dopant," *International Electron Devices Meeting 1990*, Dec. 9-12, 1990, pp. 681-684.

Wang, et al., "Design Optimization of Microwave Power Heterojunction Bipolar Transistor Cells," *IEEE 1989 MTT-S International Microwave Symposium Digest*, vol. 3, Jun. 13-15, 1989, pp. 1061-1064.

Singh, et al., "Air Bridge and Via Hole Technology for GaAs Based Microwave Devices," *Microelectronics Journal*, vol. 19, No. 5, 1988, pp. 23-27.

Wang, et al., "Design Optimization of Microwave Power Heterojunction Bipolar Transistor Cells", *IEEE MTT-S International Microwave Symposium Digest*, vol. 1, Jun. 13, 1989, pp. 1061-1065.

Singh, et al., "Air Bridge and Via Hole Technology for GaAs Based Microwave Devices", *Microelectronics Journal*, vol. 19, No. 5, Sep. 1988, pp. 23-27.

*Primary Examiner*—John B. Sotomayor
*Attorney, Agent, or Firm*—Michael K. Skrehot; James C. Kesterson; Richard L. Donaldson

[57] ABSTRACT

Generally, and in one form of the invention, a microwave heterojunction bipolar transistor suitable for low-power, low-noise and high-power applications having an emitter 108, a base 126 and a collector 24 is disclosed, wherein the base 126 is composed of one or more islands 126 of semiconductor material. The one or more islands 126 are formed so that they do not cross any boundaries of the active area 60 of the transistor.

Other devices, systems and methods are also disclosed.

28 Claims, 8 Drawing Sheets

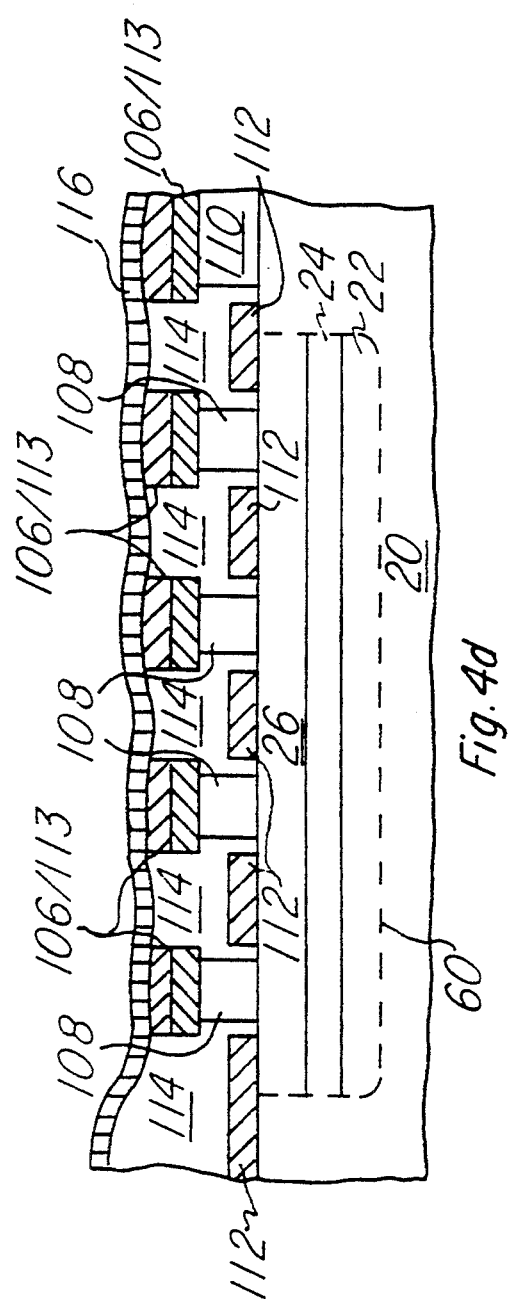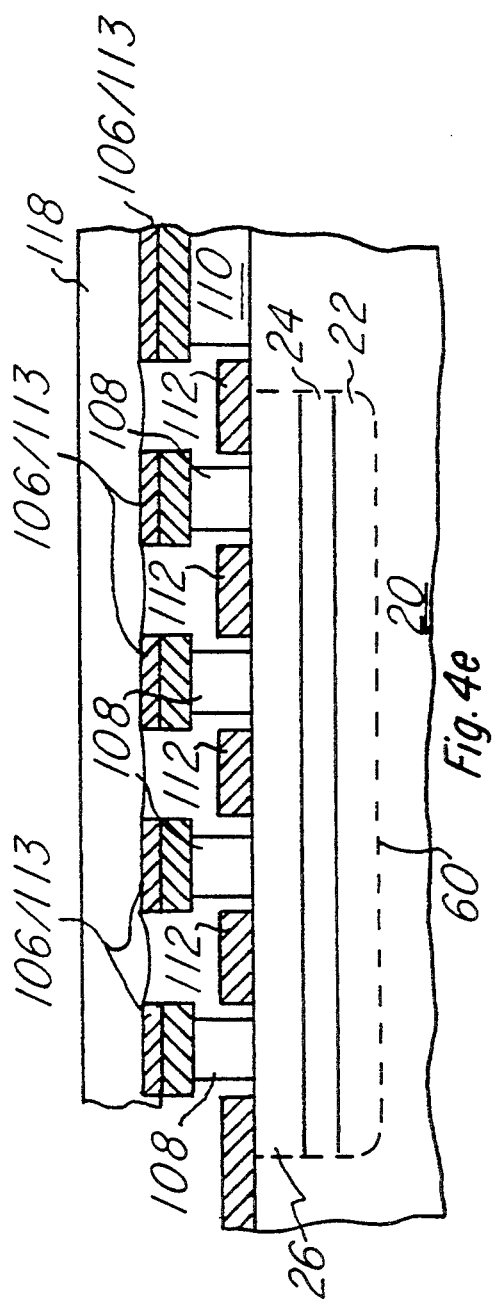

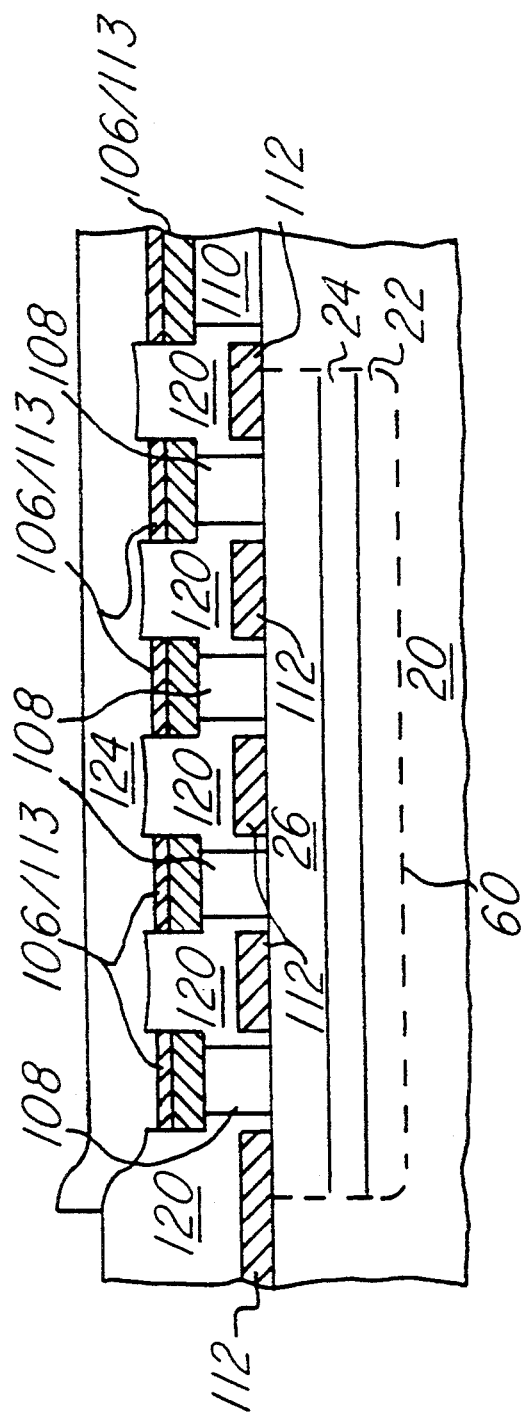
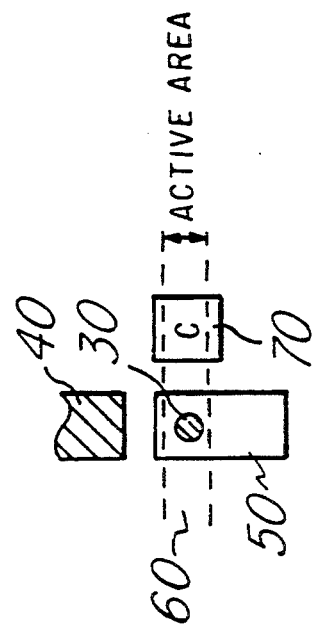
Fig. 5c
Fig. 6

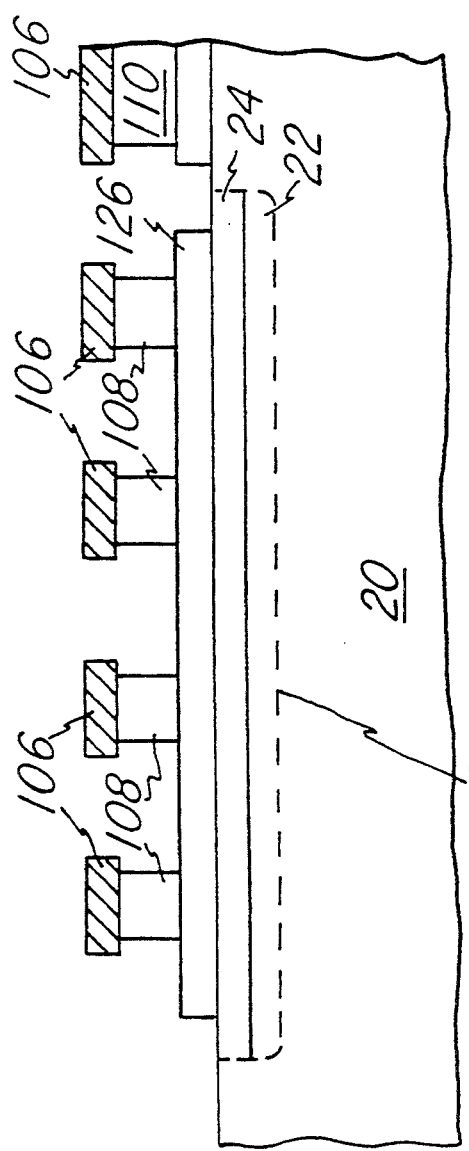
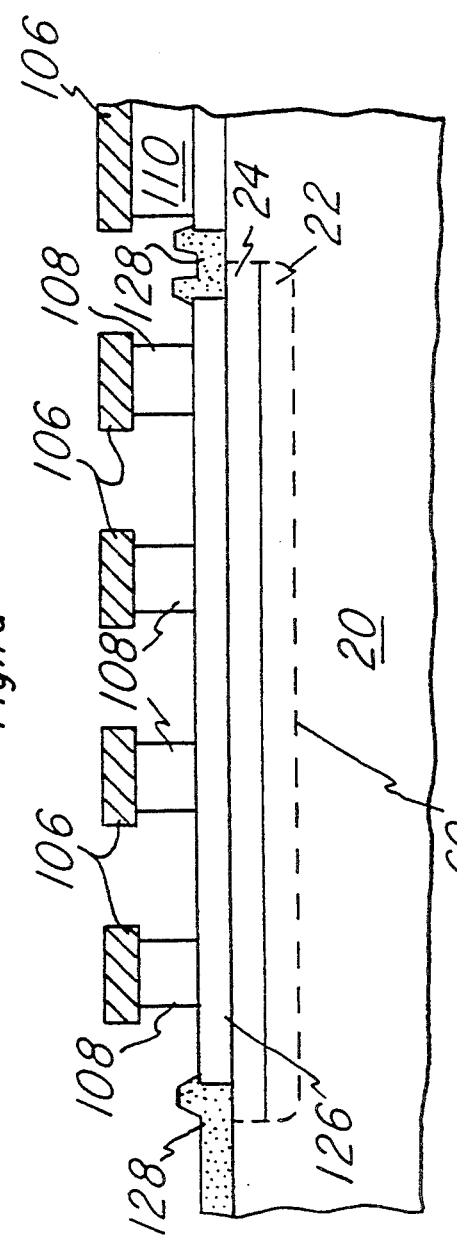

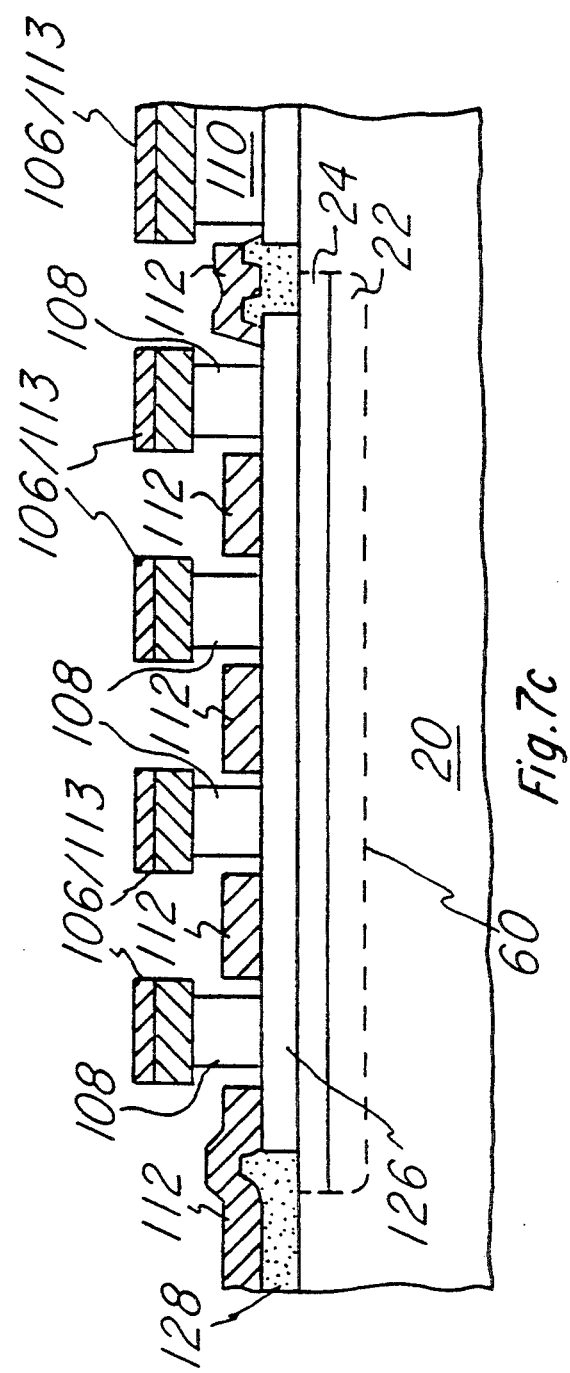

MICROWAVE HETEROJUNCTION BIPOLAR TRANSISTORS SUITABLE FOR LOW-POWER, LOW-NOISE AND HIGH-POWER APPLICATIONS AND METHOD FOR FABRICATING SAME

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned patent applications are hereby incorporated herein by reference:

| Serial No. | Filing Date | TI Case No. | STATUS |
|---|---|---|---|
| 07/662,093 | 02/28/91 | TI-15802 | ABANDONED |

FIELD OF THE INVENTION

This invention generally relates to microwave heterojunction bipolar transistors suitable for low-power, low-noise, and high-power applications.

BACKGROUND OF THE INVENTION

Heretofore, in this field, heterojunction bipolar transistor (HBT) fabrication methods have predominately been specific to the application for which the HBT was intended. Low-power circuits, such as digital circuits, require small-area devices to minimize power consumption. High-power circuits, such as power amplifiers, require a maximization of device area without the degradation of device performance. Low-noise devices, such as receivers, on the other hand, require low base resistance and low recombination current operation.

Several HBT fabrication methods have been reported in the past to address these needs, but these methods have always been applicable to only one application at a time. For instance, a fabrication method that produces good high-power devices will usually be unable to produce a good low-noise device, etc. For example, most HBT power amplifiers are fabricated with multiple emitter and base fingers running parallel to each other, as illustrated in FIG. 1. The finger dimensions and finger-to-finger spacings are determined from power gain and power output (thermal) considerations.

As the HBT technology matures, it is becoming apparent that high-speed (i.e. microwave) HBT circuits will be required to perform multiple functions within a single integrated circuit. An example of this would be a transceiver chip in a radar or communication system. This would require the fabrication of low-noise, low-power devices for the receiver section simultaneously with power devices for the transmitter section.

Accordingly, improvements in HBT fabrication techniques which overcome any or all of the limitations of the present techniques are clearly desirable.

SUMMARY OF THE INVENTION

It is herein recognized that a need exists for a microwave heterojunction bipolar transistor suitable for both low-power, low-noise and for high-power applications. One object of the present invention is directed towards meeting those needs.

Generally, and in one form of the invention, a microwave heterojunction bipolar transistor suitable for low-power, low-noise and high-power applications having an emitter, a base and a collector is disclosed, wherein the base is composed of one or more islands of semiconductor material. The islands are formed so that they do not cross any boundaries of the active area of the transistor.

In another form of the invention, a microwave heterojunction bipolar transistor suitable for low-power, low-noise and high-power applications, and a method for making same, is disclosed, comprising a semi-insulating semiconductor substrate, a collector layer of a first conductivity type disposed on the substrate, one or more base islands of a second conductivity type disposed on the collector layer, an active area defined in the substrate, collector layer and completely encompassing the one or more base islands, and an emitter of the first conductivity type having a wider energy bandgap than the one or more base islands, and conductive contacts disposed on the collector layer, the one or more base islands and the emitter, wherein the one or more base islands are disposed on the collector layer without crossing any boundaries of the active area.

In still another form of the invention, a monolithic microwave integrated circuit (MMIC) including a plurality of electrically interconnected microwave heterojunction bipolar transistors suitable for low-power, low-noise and high-power applications disposed on a semi-insulating semiconductor substrate, and a method for making same, is disclosed wherein each of said transistors comprises a collector layer of a first conductivity type disposed on the substrate, one or more base islands of a second conductivity type disposed on the collector layer, an active area defined in the substrate, collector layer and completely encompassing the one or more base islands, and an emitter region of the first conductivity type disposed on the one or more base islands and having a wider energy bandgap than the one or more base islands, and conductive contacts disposed on the collector layer, the one or more base islands and the emitter, wherein the one or more base islands are disposed on the collector layer without crossing any boundaries of the active area.

An advantage of the invention is that a single device design philosophy and process can be used to fabricate devices that are suitable for low-power, low-noise and high-power applications.

BRIEF DESCRIPTION OF THE DRAWINGS

The foregoing and further aspects of the invention are illustrated in the accompanying drawings wherein like elements are denoted by like reference designators and in which:

FIG. 4A-E is a cross sectional view illustrating the fabrication steps of a second preferred embodiment high power HBT.

FIG. 5A-C is a cross sectional view illustrating the fabrication steps of a third preferred embodiment high power HBT.

FIG. 6 is a plan view of a fourth preferred embodiment of the present invention, without emitter metallization.

FIG. 7A-C is a cross sectional view illustrating the fabrication steps of a fifth preferred embodiment of the present invention.

DETAILED DESCRIPTION OF PREFERRED EMBODIMENTS

Figure 1:
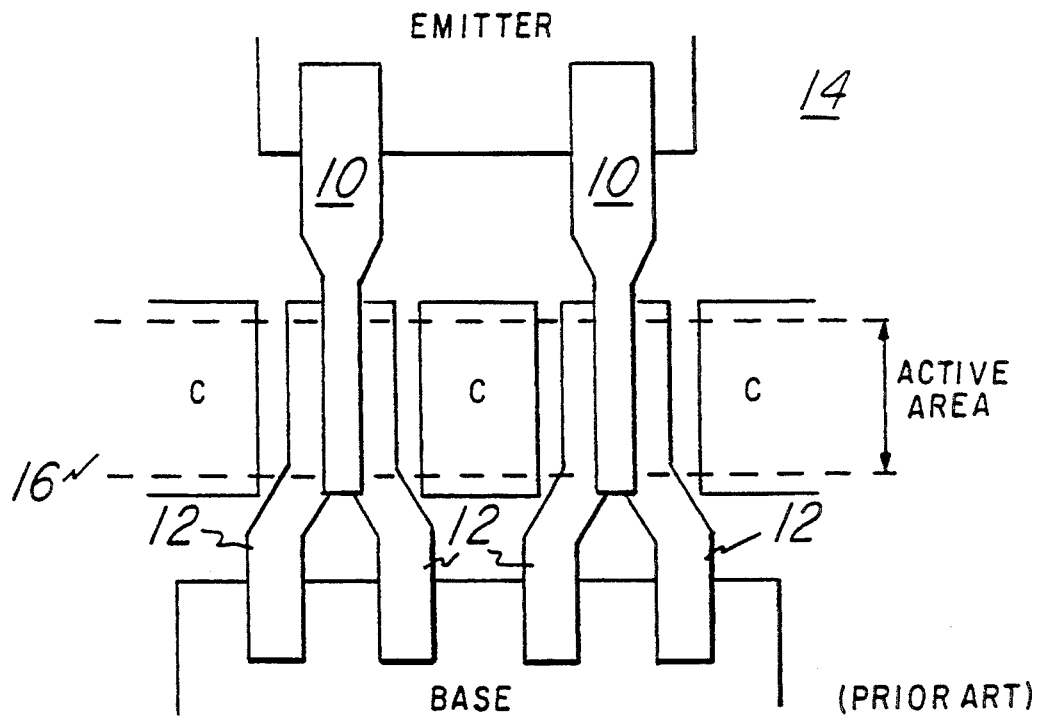
FIG. 1 is a plan view of a prior art HBT power device.

In the prior art device shown in FIG. 1, all emitter fingers 10 and base fingers 12 are connected to each other on semi-insulating substrate 14. The device active area 16 is defined by ion implantation. A more thorough description of this device may be found in co-pending U.S. patent application 07/701,570 by the same applicant and assigned to the same assignee as the present application (and incorporated herein by reference). Although this approach is well suited to power device fabrication, it has several disadvantages when used to fabricate low-power and low-noise devices. These include:

1) The active area is determined by ion implantation. This enhances recombination currents at the emitter-base junction which increase 1/f noise and lower current gain.

2) It is difficult to define very small device areas with this method (e.g. emitter finger length cannot be much smaller than 3-5 microns).

3) Since the base current is injected only from the edges of the emitter area, the base series resistance due to the section of base under the emitter contact remains high. A reduction of this resistance is only possible by reducing the finger width, which in turn reduces power density.

4) The emitter finger length is limited by current density limitations in the emitter metal. Since all emitter current is supplied from one end of the emitter finger, electromigration current limits in the emitter contact metal are exceeded for fingers longer than 30 microns and emitter metal thicknesses of 0.6-1.0 micron. The fabrication technique of the present invention makes use of the breaking up of the device active area into smallest geometry areas and the low-loss combination of these areas for each specific application. The first preferred embodiment method will describe the fabrication of a high-power device. Subsequent preferred embodiments will describe other device types.

Figure 2:
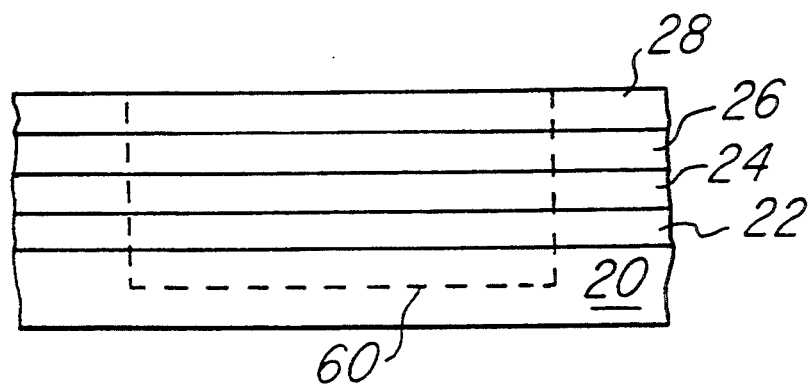
FIG. 2 is a cross sectional view illustrating the substrate and epitaxial layers used to construct the first preferred embodiment device of FIG. 3.

FIG. 2 illustrates a cross sectional view of the semiconductor wafer used to construct a first preferred embodiment device of the present invention. A semi-insulating semiconductor substrate 20 (such as (100) GaAs) is provided onto which an n+-type subcollector layer 22, such as GaAs is epitaxially grown by a suitable process (such as Metal Organic Chemical Vapor Deposition, or MOCVD) and in situ doped with Si at a concentration of approximately $>2\times 10^{18}$. Next, an n-type collector epitaxial layer 24, such as GaAs, is grown and doped with Si at a concentration of approximately $1\times 10^{16}$. A p-type base layer 26, such as GaAs, is then epitaxially grown and doped with C or Zn at a concentration of approximately $1-2\times 10^{19}$. Finally, n-type emitter layer 28, of a semiconductor material with a wider bandgap than base layer 26, such as AlGaAs, is epitaxially grown and doped with Si at a concentration of approximately $2\times 10^{17}$. It is comprehended that emitter layer 28 may be composed of several additional sublayers, such as a GaAs contact sublayer or a GaAs/AlGaAs grading sublayer abutting the base layer 26, for instance. After all epitaxial layers 22-28 have been grown, the active area 60 is defined by protecting the active area with a photoresist/$Si_2N_4$/Au mask during a high energy ion implantation of the wafer. Ions such as oxygen, gallium, boron, etc. are suitable for this process. The implantation deactivates the dopants and converts the implanted non-active regions into a highly resistive (semi-insulating) state. Note that the implanted ions are not activated by annealing.

Figure 3:
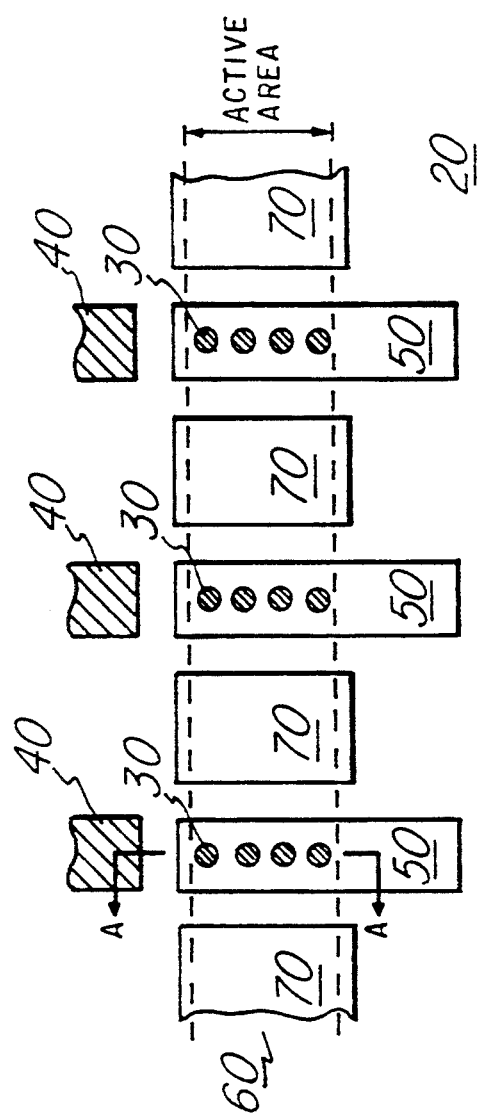
FIG. 3 is a plan view of a first preferred embodiment of the present invention, without emitter metallization.

FIG. 3 contains a plan view of the first preferred embodiment of the present invention. The device is constructed on substrate 20 and epitaxial layers 22-28 of FIG. 2. The device area is divided up into a series of small emitter disks 30 (although the present invention comprehends the use of alternative geometries to define the emitter portions, such as squares, rectangles, etc.) which are formed inside the active area 60. Emitter disks 30 and emitter conductors 40 each consist of a metal contact overlying a region of semiconductor material which has a wider bandgap than that of the base layer 26. Emitter disks 30 and emitter conductors 40 may be later connected by an air bridge. Base contact metallization 50 is provided which completely surrounds the emitter disks 30. The device also includes an active area 60 formed by ion implantation into the substrate as well as collector contacts 70.

Subsequent preferred embodiments will illustrate various methods for connecting the emitter disks 30 to the emitter conductors 40 in order to achieve different device performance characteristics. By breaking the device active area up into smallest geometry areas and selectively connecting varying numbers of the emitter disks 30 to the rest of the device, it is possible to use a single semiconductor process to fabricate high-power, medium-power and/or low-power, low-noise HBT devices on a single substrate. An important advantage is achieved by the fact that the emitter area no longer crosses over the implantation edge defining the active area 60. This is due to the fact that most of the recombination current, which is responsible for increased noise and reductions in current gain, is at the edge of the active area 60 (the interface between the implanted and the non-implanted areas). If the emitter lays over this interface, recombination currents increase. It is also important to note that the base contact 50 completely surrounds the emitter active area, thus reducing the base contact resistance by at least a factor of two. This is due to the fact that base contacts are made from two sides of a standard emitter finger (such as 10 in FIG. 1). If this emitter 10 were, for example, 2 $\mu m\times 20$ $\mu m$, the base-emitter interface would be 40 $\mu m$, or 20 $\mu m$ per side. If the same emitter area is achieved by 13 emitter disks 30 which are each 2 $\mu m$ in diameter, the base contact will be made around the entire circumference of each emitter disk. The total base-emitter interface (total disk 30 circumference) is 81.64 $\mu m$. Therefore, the base-emitter interface is twice as long, the base resistance is then half as much, and the maximum frequency of the device increases by approximately 40%.

A second preferred embodiment of the present invention is a method for fabricating high power heterojunction bipolar transistors (HBTs) using the circuit of FIG. 3 as a basis and includes the following steps as illustrated in the cross sectional elevation views (taken through axis A—A in FIG. 3) of FIGS. 4A–4E.

Figure 4A:
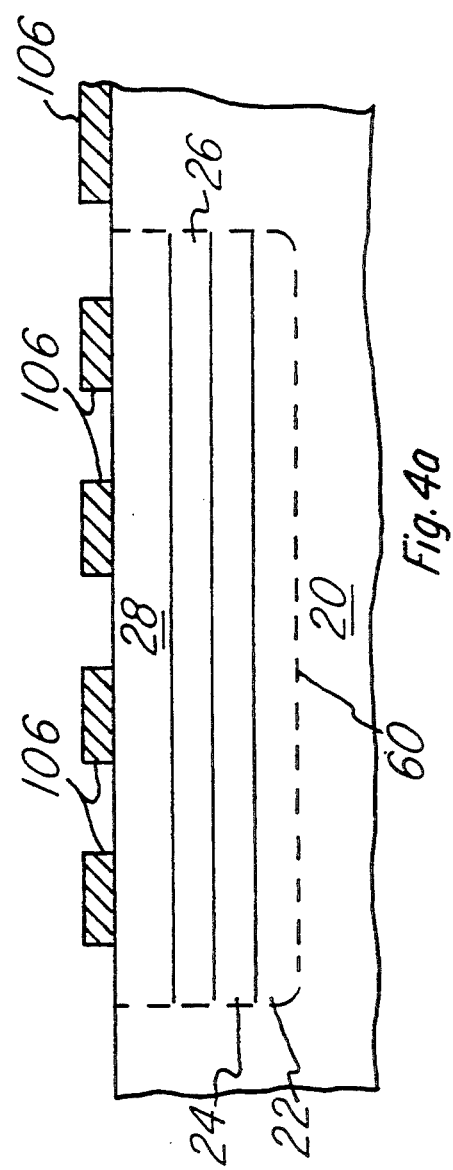

(a) A starting substrate material for this process is shown in FIG. 4A; note that the relative dimensions in the drawings are exaggerated for clarity. It is composed of a semi-insulating semiconductor material 20 (such as GaAs) of (100) orientation onto which have been epitaxially grown subcollector layer 22, collector layer 24, base layer 26 and emitter layer 28 as described in relation to FIG. 2. Active area 60 is defined by ion implantation which is also described in relation to FIG. 2.

(b) Photoresist is spun on and patterned to define the location of emitter contacts 106. AuGe/Ni/Au metals are evaporated in sequence at thicknesses of 500, 140 and 4000 Angstroms, respectively, onto the photoresist and exposed areas. The photoresist is then removed, which lifts off the metal except those portions 106 that define the emitter contacts. The contacts 106 are then alloyed at 435° C. for 2 minutes to complete the ohmic contact formation.

Figure 4B:
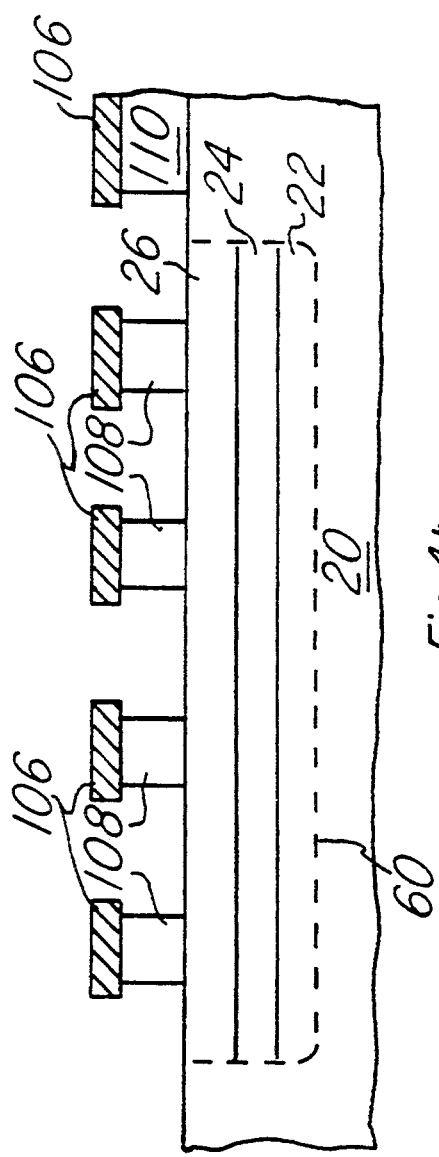

(c) As shown in FIG. 4B, emitter disks 108 and emitter contact support 110 are formed by etching all portions of the emitter epilayer 28 not masked by emitter contacts 106 down to the base epilayer 26 using a reactive ion etch (RIE in $BCl_3$, $CCl_2F_2$, or $CCl_4$) or similar anisotropic etch technique. It is preferred that a short wet chemical etch (using, for example, $H_2SO_4:H_2O_2:H_2O$ in a ratio of 1:8:160 by volume) is used as a last part of this step in order to produce a small undercut of the emitter epilayer material (this will isolate the emitter disk 108 from the base contact as described below in step (d)). The wet chemical etch will also remove the damaged layers produced by the RIE etch.

Figure 4C:
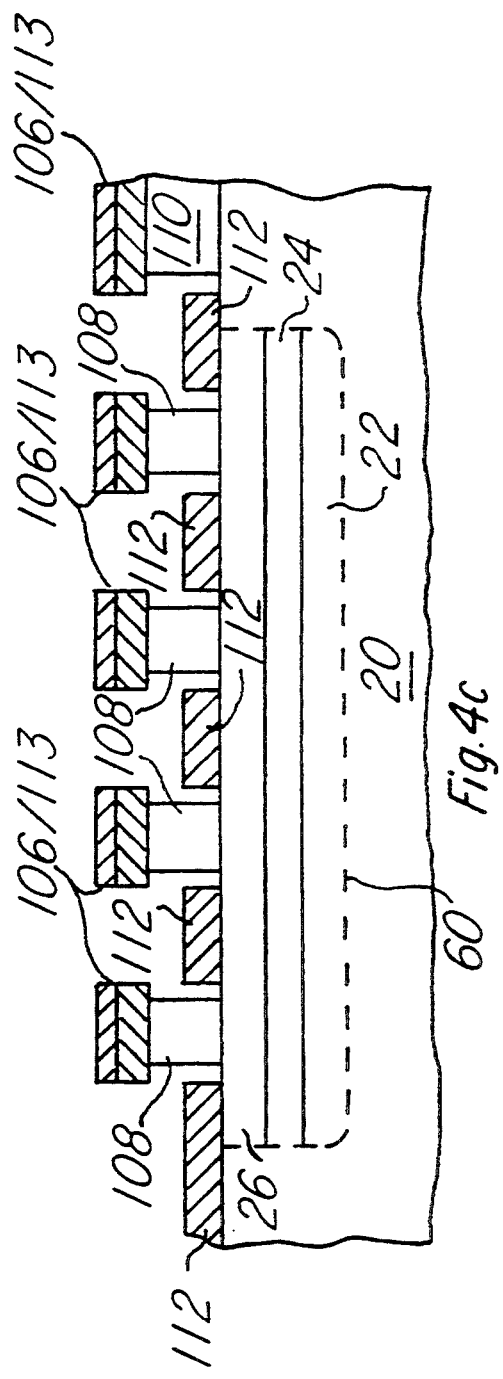

(d) The base contacts 50 of FIG. 3 are defined with photoresist and suitable base metals such as Ti/Pt/Au in thicknesses of 500, 250 and 2000 Angstroms, respectively, are sequentially evaporated onto the photoresist and exposed areas. As shown in FIG. 4C, the photoresist is then removed, which lifts off the metal except those portions 112 that define the base contacts and those portions 113 overlying emitter contacts 106. Because of the undercut of the emitter caused by the wet chemical etch in step (c), the emitter disks 108 and the base contacts 112 are self-aligned and will be separated by approximately 0.1–0.2 micron.

(e) Collector contacts 70 (not visible in the cross sectional view of FIG. 4) are established by depositing a photoresist mask to define the collector contact area, chemically etching down to the subcollector 22 epilayer in a solution of $H_2SO_4:H_2O_2:H_2O$ (1:8:160), and then evaporating AuGe/Ni/Au in sequence at thicknesses of 500, 140 and 4000 Angstroms, respectively. The evaporation mask is then removed which lifts off all metal except in the collector contact 70 areas. The contacts 70 are then alloyed at 435° C. for 2 minutes to complete the ohmic contact formation.

(f) As shown in FIG. 4D, a positive photoresist 114 is spun onto the wafer. The regions immediately surrounding the emitter contacts 106/113 are underexposed to UV light at an exposure dose which will only develop a portion of the resist 114. After developing, the tops of emitter contact metal 106/113 become exposed, whereas the rest of the emitter structure is covered with resist. Next, the remaining photoresist 114 is hard baked, after which the entire wafer is sputtered with Au film 116 to a thickness of 200–500 Angstroms. The Au film layer makes contact to all emitter contacts 106/113.

(g) Another layer of photoresist is spun on and an emitter bridge connector area is defined which overlays the emitter contacts 106/113. 2–3 microns of Au is electroplated inside the patterned areas, after which both layers of photoresist and the exposed portions of Au film 116 are removed, leaving an emitter connector 118 in the form of a bridge connecting each emitter disk 106/108 and emitter contact 106/110, as shown in FIG. 4E.

(h) The remainder of the transistor fabricating follows standard semiconductor processing techniques. Another air bridge is used to connect all collector contacts 70, passive circuit elements, such as capacitors and transmission lines, are fabricated, the wafer is lapped to the desired thickness and via holes are fabricated. These steps follow standard fabrication techniques.

Figure 5A:
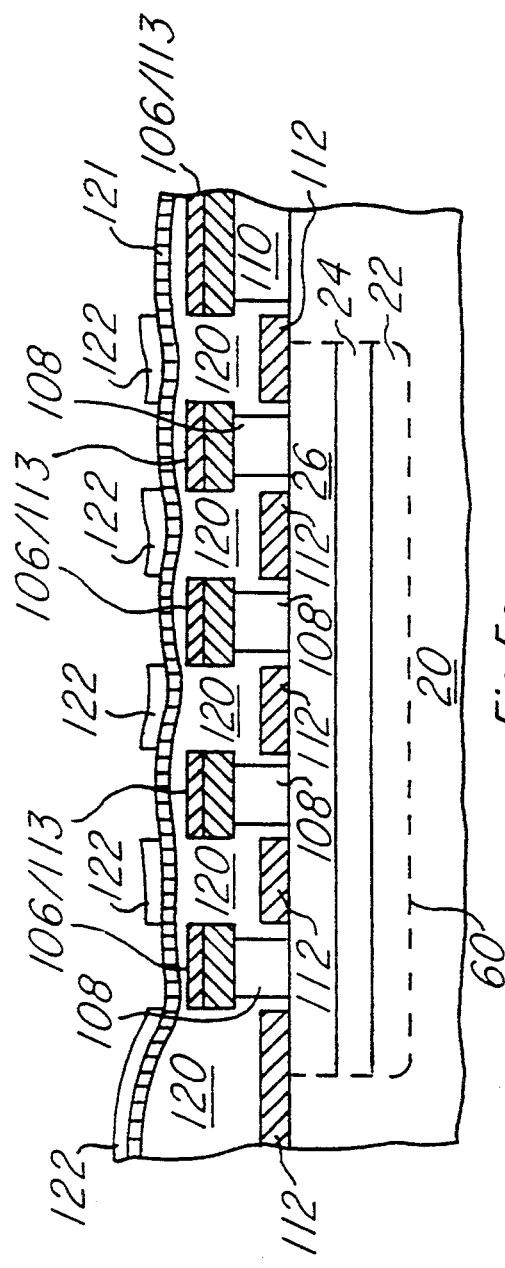
Figure 5B:
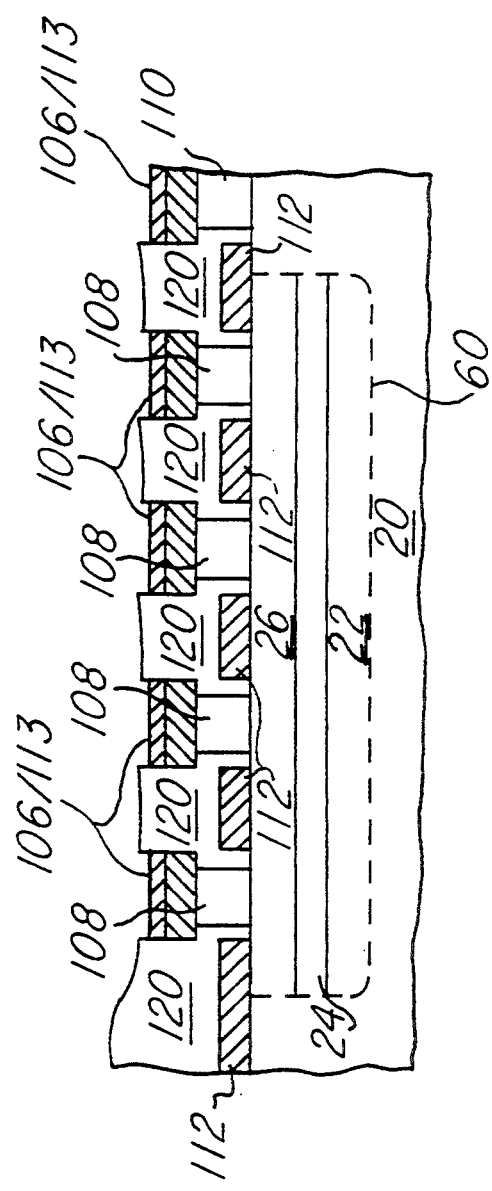

A third preferred embodiment fabrication method of the present invention is also directed toward the fabrication of high-power HBTs. This method is identical to the second preferred embodiment method with the exception of different steps (f) and (g) as follows:

(f) As shown in FIG. 5A, a layer of polyimide 120 is spun on to a thickness of 1.5–2.0 μm and then fully cured. A thin layer of Ge 121 (500 Angstroms) is then evaporated over the polyimide 120. A layer of photoresist 122 is spun onto the wafer and the regions immediately above the emitter contacts 106/113 are defined in the resist, and the exposed regions of Ge layer 121 are etched down to polyimide 120 using an $CF_4:O_2$ plasma etch, after which the remaining photoresist 122 is removed. The remaining Ge 121 is next used as a mask to etch the polyimide 120 in these openings down to the emitter contacts 106/113 using oxygen RIE. Only the tops of emitter contacts 106/113 are exposed in this process. The remaining Ge layer 121 is then removed with a $H_2O_2$ solution or $CF_4:O_2$ plasma. The resultant structure is shown in FIG. 5B.

(g) The entire wafer is sputtered with Au film 123 to a thickness of 200–500 Angstroms. The Au film layer makes contact to all emitter contacts 106/113. Another layer of photoresist is spun on and an emitter bridge connector 124 area is defined which overlays the emitter contacts 106/113. 2–3 microns of Au is electroplated inside the patterned areas, after which the photoresist and the Au film are removed, leaving an emitter connector 124 in the form of a bridge connecting each emitter disk 106/108 and emitter contact 106/110, as shown in FIG. 5C.

At this point, the polyimide layer 120 can either be removed, or left in place as a protective coating.

A fourth preferred embodiment of the present invention is illustrated in FIG. 6 and is directed toward the fabrication of low-power, low-noise HBTs. The circuit of FIG. 6 contains an emitter disk 30, emitter contact 40, base metallization 50, active area 60 and collector contact 70. These elements are analogous to the like numbered structures in FIG. 3. In the low-power, low-noise embodiment, however, only a small emitter disk 30 area is required (for example, one disk 30 is shown in FIG. 6). The second and third preferred embodiment fabrication techniques can be used to make the device of FIG. 6 with no modifications to the process. The artwork of the various photoresist masks will determine whether a high-power device or a low-power, low-noise device is formed. In either case, the fabrication process steps are the same.

The fourth preferred embodiment of the present invention, as illustrated in FIG. 6, will provide improved low-power, low-noise performance over prior art devices due to the fact that the emitter area does not cross over the implantation edge defining the active area 60, as it does in prior art devices. The advantage is achieved because most of the recombination current, which is responsible for increased noise in the device, has been found to be at the edge of the active area 60 (the interface between the implanted and non-implanted areas). If the emitter were to cross this boundary, recombination currents would increase, thereby increasing the noise of the device. Consequently, good low-noise performance is available from devices constructed according to the present invention, as is good high-power performance. The same process may be used to construct both types of devices on the same substrate, such as in a monolithic microwave integrated circuit (MMIC), without sacrificing the performance of either device type.

A fifth preferred embodiment of the present invention is a modification that may be applied to any of the devices or fabrication sequences illustrated herein, or to other bipolar devices, by forming the contact to the base of the transistor in such a way as to not cross the active area 60 boundary. This will provide even more reduction in noise in the device due to a reduction in the recombination currents at the active area 60 boundary. Another advantage provided by the fifth preferred embodiment is an improved base-collector reverse breakdown voltage. In a high voltage transistor, the base-collector reverse breakdown predominates the device maximum operating voltage. A base contact crossing over the edge of the implantation area can lower the base-collector junction breakdown voltage since the contact is in parallel with the base-collector p-n junction. Any leakage current at this active/passive device region interface lowers the high voltage performance of the HBT. The fifth preferred embodiment of the present invention will be described herein as a modification to the second preferred embodiment by way of illustration only. It is intended that any HBT may benefit from the reduced noise provided by the fifth preferred embodiment.

(a) Steps (a)–(c) of the second preferred embodiment may be performed unmodified.

(b) As illustrated in FIG. 7A, a photoresist mask (not shown) is spun onto the wafer and patterned to define base mesa 126. The surface of the wafer is then anisotropically or isotropically etched down to collector layer 24, thereby defining base mesa 126. The etch may be, for example, a wet etch in $H_2SO_4:H_2O_2:H_2O$ (1:8:160 by volume) or reactive ion etches such as $BCl_3$, $CCl_4$ or $CCl_2F_2$. It is important that the boundaries of base mesa 126 be within the boundaries of the active area 60. The photoresist layer is then dissolved and removed.

(c) FIG. 7B shows a layer of silicon nitride 128 deposited onto the wafer to fill the voids between the boundaries of base mesa 126 and the rest of the wafer. Other non-conductive materials, such as $SiO_2$, etc. may be used in place of the silicon nitride. The layer 128 is deposited onto the wafer and photoresist (not shown) is used to define the areas where it is desired that the $Si_3N_4$ layer 128 remain. This pattern overlaps the edge of base mesa 126. The photoresist is then post baked to produce a tapered edge. The wafer is then subjected to a plasma etch of $CF_4:O_2$ (8% oxygen), for example, which etches both the silicon nitride layer 128 and the photoresist, however the photoresist is etched at a slower rate. Because of the taper present at the photoresist edge, the etched $Si_3N_4$ 128 edge is automatically tapered, allowing for easier metal crossover to the base mesa 126 in step (d) below. Although silicon nitride is preferred, those skilled in the art will recognize that any non-conductive material or combination of materials that may be conveniently deposited or grown to fill the voids between the base mesa 126 and the remainder of the wafer may be substituted.

(d) In FIG. 7C, base contact metallization 112 is deposited as described in step (d) of the second preferred embodiment. The main difference is that now the base contacts 112 do not cross over the active area 60 boundaries due to the presence of the silicon nitride areas 128. This will provide better low-noise performance of the device due to the reduced level of recombination currents present at the active area 60 boundary as well as reduced leakage current in high voltage devices. The remaining stops in the fabrication of the device are essentially the same as described in steps (e)–(h) of the second preferred embodiment.

It will be appreciated by those skilled in the art that several modifications may be made to the fifth preferred embodiment, such as forming the base mesa to be several islands of base material or contacting the base mesa(s) with an air bridge structure.

A few preferred embodiments have been described in detail hereinabove. It is to be understood that the scope of the invention also comprehends embodiments different from those described, yet within the scope of the claims.

Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A heterojunction bipolar transistor having an emitter, a base, and a collector, wherein said base is at least one island of semiconductor material, said island having a boundary that lies within, and is separate from, any boundaries of an active area of said transistor.

2. The microwave heterojunction bipolar transistor of claim 1 wherein said at least one base island is surrounded by a non-conductive area.

3. The microwave heterojunction bipolar transistor of claim 2 wherein said at least one base island is contacted by a conductive layer at least partially overlying said non-conductive area.

4. The microwave heterojunction bipolar transistor of claim 1 wherein said at least one base island is contacted by an air bridge.

5. The microwave heterojunction bipolar transistor of claim 1 wherein said collector and said base are GaAs and said emitter is $Al_xGa_{1-x}As$.

6. The microwave heterojunction bipolar transistor of claim 1 wherein said emitter is at least one island of semiconductor material, said at least one island not crossing any boundaries of said active area of said transistor.

7. A heterojunction bipolar transistor comprising:
a semi-insulating semiconductor substrate;
a collector layer of a first conductivity type disposed on said substrate;
at least one base island of a second conductivity type disposed on said collector layer;
an active area defined in said substrate and said collector layer and encompassing said at least one base island;
an emitter of said first conductivity type disposed on said at least one base island and having a wider energy bandgap than said at least one base island; and
conductive contacts disposed on said collector layer, said at least one base island and said emitter, wherein said at least one base island is disposed on said collector layer and has a boundary that lies within, and is separate from, any boundaries of said active area.

8. The microwave heterojunction bipolar transistor of claim 7 wherein said active area is defined by ion implantation.

9. The microwave heterojunction bipolar transistor of claim 7 wherein said at least one base island is surrounded by a non-conductive area.

10. The microwave heterojunction bipolar transistor of claim 9 wherein said at least one base island is contacted by a conductive layer at least partially overlying said non-conductive area.

11. The microwave heterojunction bipolar transistor of claim 7 wherein said conductive contact disposed on said at least one base island is an air bridge.

12. The microwave heterojunction bipolar transistor of claim 7 wherein said substrate, said collector layer and said at least one base island are GaAs and said emitter is $Al_xGa_{1-x}As$.

13. The microwave heterojunction bipolar transistor of claim 7 wherein said conductive contacts are ohmic.

14. The microwave heterojunction bipolar transistor of claim 7 wherein said collector layer, said at least one base island and said emitter are deposited epitaxially.

15. The microwave heterojunction bipolar transistor of claim 14 wherein said collector layer, said at least one base island and said emitter are doped in situ.

16. The microwave heterojunction bipolar transistor of claim 7 wherein said first conductivity type is n-type and said second conductivity type is p-type.

17. The microwave heterojunction bipolar transistor of claim 7 wherein said emitter is at least one island of semiconductor material, said at least one island not crossing any boundaries of said active area of said transistor.

18. A monolithic microwave integrated circuit (MMIC) including a plurality of electrically interconnected heterojunction bipolar transistors disposed on a semi-insulating semiconductor substrate wherein each of said transistors comprises:
a collector layer of a first conductivity type disposed on said substrate;
at least one base island of a second conductivity type disposed on said collector layer;
an active area defined in said substrate and said collector layer and completely encompassing said at least one base island;
an emitter island of said first conductivity type disposed on said at least one base island and having a wider energy bandgap than said at least one base island; and
conductive contacts disposed on said collector layer, said at least one base island and said emitter, wherein said at least one base island is disposed on said collector layer and has a boundary that lies within, and is separate from, any boundaries of said active area.

19. The monolithic microwave integrated circuit of claim 18 wherein said active area is defined by ion implantation.

20. The monolithic microwave integrated circuit of claim 18 wherein said at least one base island is surrounded by a non-conductive area.

21. The monolithic microwave integrated circuit of claim 20 wherein said at least one base island is contacted by a conductive layer at least partially overlying said non-conductive area.

22. The monolithic microwave integrated circuit of claim 18 wherein said conductive contact disposed on said at least one base island is an air bridge.

23. The monolithic microwave integrated circuit of claim 18 wherein said substrate, said collector layer and said at least one base island are GaAs and said emitter is $Al_xGa_{1-x}As$.

24. The monolithic microwave integrated circuit of claim 18 wherein said conductive contacts are ohmic.

25. The monolithic microwave integrated circuit of claim 18 wherein said collector layer, said at least one base layer and said emitter are deposited epitaxially.

26. The monolithic microwave integrated circuit of claim 25 wherein said collector layer, said at least one base island and said emitter are doped in situ.

27. The monolithic microwave integrated circuit of claim 18 wherein said first conductivity type is n-type and said second conductivity type is p-type.

28. The monolithic microwave integrated circuit of claim 18 wherein said emitter is at least one island of semiconductor material, said at least one island not crossing any boundaries of said active area.

* * * * *